United States Patent
Kato et al.

(10) Patent No.: US 7,094,708 B2
(45) Date of Patent: Aug. 22, 2006

(54) METHOD OF CVD FOR FORMING SILICON NITRIDE FILM ON SUBSTRATE

(75) Inventors: Hitoshi Kato, Tokyo (JP); Koichi Orito, Tokyo (JP); Hiroyuki Kikuchi, Tokyo (JP); Shingo Maku, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 12 days.

(21) Appl. No.: 10/518,025

(22) PCT Filed: Jan. 19, 2004

(86) PCT No.: PCT/JP2004/000370

§ 371 (c)(1),
(2), (4) Date: Dec. 15, 2004

(87) PCT Pub. No.: WO2004/066377

PCT Pub. Date: Aug. 5, 2004

(65) Prior Publication Data

US 2005/0255712 A1    Nov. 17, 2005

(30) Foreign Application Priority Data

Jan. 24, 2003  (JP) .............................. 2003-016659

(51) Int. Cl.
*H01L 21/31* (2006.01)

(52) U.S. Cl. ..................................................... 438/778
(58) Field of Classification Search ................ 438/628, 438/627, 202, 778
See application file for complete search history.

(56) References Cited

U.S. PATENT DOCUMENTS

| | | | | |
|---|---|---|---|---|
| 6,475,902 | B1* | 11/2002 | Hausmann et al. | 438/627 |
| 2005/0095770 | A1* | 5/2005 | Kumagai et al. | 438/202 |

FOREIGN PATENT DOCUMENTS

| | | |
|---|---|---|
| JP | 7-273106 | 10/1995 |
| JP | 11-172439 | 6/1999 |
| WO | 03 046253 | 6/2003 |

* cited by examiner

*Primary Examiner*—Carl Whitehead, Jr.
*Assistant Examiner*—Monica D. Harrison
(74) *Attorney, Agent, or Firm*—Oblon, Spivak, McClelland, Maier & Neustadt, P.C.

(57) ABSTRACT

A CVD method is to form a silicon nitride film on a target substrate (W). The method includes heating the substrate (W) accommodated in a process container (8), at a process temperature, and supplying a process gas including hexa-ethylamino-disilane gas and ammonia gas onto the substrate (W) heated at the process temperature, thereby depositing a silicon nitride film on the substrate (W).

15 Claims, 4 Drawing Sheets

METHOD OF CVD FOR FORMING SILICON NITRIDE FILM ON SUBSTRATE

REFERENCE TO PRIOR APPLICATIONS

The present application is a U.S. National Phase Application under, 35 USC § 371, of International Application PCT/JP2004/000370, filed Jan. 19, 2004.

TECHNICAL FIELD

The present invention relates to a CVD method for forming a silicon nitride film on a target substrate, used in a semiconductor process. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an LCD (Liquid Crystal Display) or FPD (Flat Panel Display), by forming semiconductor layers, insulating layers, and conductive layers in predetermined patterns on the target substrate.

BACKGROUND ART

Semiconductor devices include insulating films made of a material, such as $SiO_2$, PSG (Phospho Silicate Glass), P(plasma)-SiO, P(plasma)-SiN, SOG (Spin On Glass), $Si_3N_4$ (silicon nitride), etc.

For example, Jpn. Pat. Appln. KOKAI Publication No. 11-172439 discloses a method of forming a silicon oxide film or silicon nitride film on the surface of a semiconductor wafer by thermal CVD (Chemical Vapor Deposition). In such thermal CVD, a silane family gas, such as monosilane ($SiH_4$), dichlorosilane ($SiH_2Cl_2$), hexachlorodisilane ($Si_2Cl_6$), or bistertialbutylamino-silane (BTBAS), is used as a silicon-containing gas.

Specifically, for example, where a silicon oxide film is deposited, such a gas combination is used, as $SiH_4+N_2O$, $SiH_2Cl_2+N_2O$, or TEOS (tetraethyl-orthosilicate)$+O_2$. Where a silicon nitride film is deposited, such a gas combination is used, as $SiH_2Cl_2+NH_3$, or $Si_2Cl_6+NH_3$.

As described later, however, the present inventors have found that an insulating film formed by conventional film-formation methods of this kind causes a problem in a cleaning process subsequently performed. Specifically, where a lower process temperature of film-formation is used in conventional film-formation methods, the etching rate of an insulating film becomes higher, thereby bringing about lower controllability in the film thickness in the cleaning process subsequently performed.

DISCLOSURE OF INVENTION

An object of the present invention is to provide a CVD method for forming a silicon nitride film on a target substrate, which can employ a relatively low process temperature of film-formation, while allowing a cleaning process to be subsequently performed with high controllability in the film thickness of the silicon nitride film.

According to a first aspect of the present invention, there is provided a CVD method for forming a silicon nitride film on a target substrate, the method comprising:

heating the substrate accommodated in a process container, at a process temperature; and supplying a process gas including hexaethylamino-disilane gas and ammonia gas onto the substrate heated at the process temperature, thereby depositing a silicon nitride film on the substrate.

According to a second aspect of the present invention, there is provided a CVD method for forming a silicon nitride film on a target substrate, the method comprising:

heating the substrate accommodated in a process container, at a process temperature; and alternately supplying a first process gas including hexaethylaminodisilane gas and a second process gas including ammonia gas in cycles onto the substrate heated at the process temperature, thereby depositing a silicon nitride film on the substrate, wherein supplying the second process gas comprises turning the second process gas into plasma for excitation.

BEST MODE FOR CARRYING OUT THE INVENTION

In the process of developing the present invention, the inventors studied conventional methods for forming a silicon oxide film or silicon nitride film by thermal CVD. As a result, the inventors have arrived at the findings given below.

Specifically, owing to the demands of increased miniaturization and integration of semiconductor integrated circuits, silicon oxide films and silicon nitride films need to be made thinner. Furthermore, in order to maintain the electric properties of the various films that lie below insulating films, the temperature used in thermal CVD in forming the insulating films needs to be lowered. In this respect, for example, where a silicon nitride film is deposited by thermal CVD, a high process temperature of about 760° C. is conventionally used. In recent years, where a silicon nitride film is deposited by thermal CVD, a process temperature of about 600° C. is used, as the case may be.

After an insulating film is formed, contaminants such as organic substances and particles may have stuck to the surface of the insulating film. In order to remove the contaminants, a cleaning process is performed, before another thin film is formed on the insulating film. In this cleaning process, the semiconductor wafer is immersed in a cleaning solution, such as dilute hydrofluoric acid, and the surface of the insulating film is etched by a very small amount, thereby removing the contaminants.

Where an insulating film of silicon nitride is formed by thermal CVD at a higher process temperature of, e.g., about 760° C., the etching rate of the insulating film during the cleaning process is very small. Accordingly, the insulating film is not excessively etched by cleaning, and thus the cleaning process is performed with high controllability in the film thickness.

On the other hand, where an insulating film of silicon nitride is formed by thermal CVD at a lower process temperature of, e.g., about 600° C., the etching rate of the insulating film during the cleaning process is relatively large. Accordingly, the insulating film may be excessively etched by cleaning, and thus the cleaning process entails lower controllability in the film thickness.

However, where hexaethylaminodisilane is used as a material in thermal CVD to form a silicon nitride film, the etching rate of the film during the cleaning process is reduced. Accordingly, the silicon nitride film is not excessively etched by cleaning, and thus the cleaning process is performed with high controllability in the film thickness.

An embodiment of the present invention achieved on the basis of the findings given above will now be described with reference to the accompanying drawings. In the following description, the constituent elements having substantially the same function and arrangement are denoted by the same reference numerals, and a repetitive description will be made only when necessary.

First Embodiment

Figure 1:
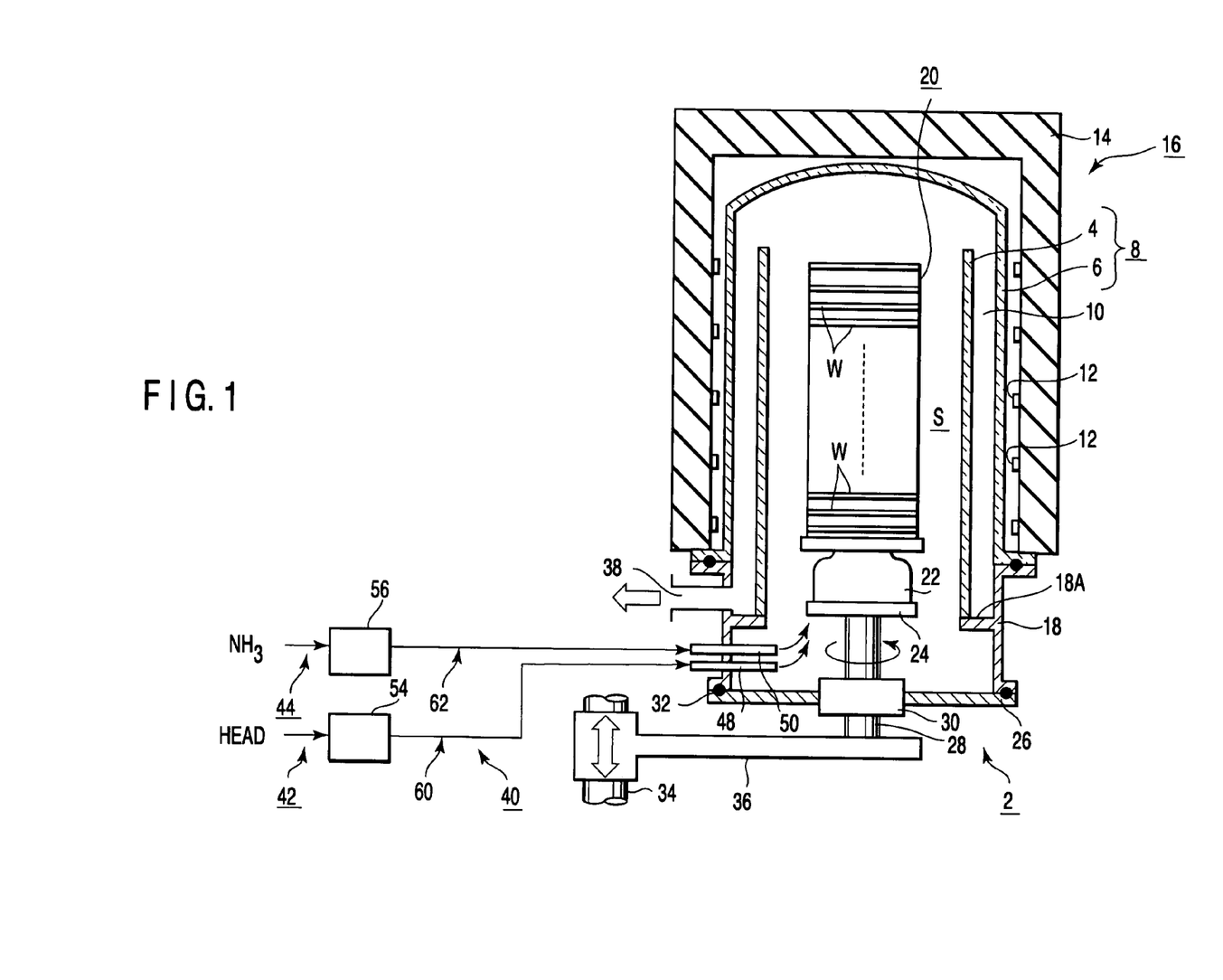
FIG. 1 is a sectional view showing a film-formation apparatus (vertical CVD apparatus) according to a first embodiment of the present invention.

FIG. 1 is a sectional view showing a film-formation apparatus (vertical CVD apparatus) according to a first embodiment of the present invention. The film-formation apparatus 2 is arranged to supply a process gas including hexaethylaminodisilane [$C_{12}H_{36}N_6Si_2$] (which will be referred to as HEAD, as well) gas used as a silicon-containing material gas, and $NH_3$ gas, so as to deposit a silicon nitride film (which will be referred to as SiN, as well).

The film-formation apparatus 2 includes a process container 8 having a double tube structure, which is formed of an inner tube 4 and an outer tube 6. The inner tube 4 and outer tube 6 are formed of cylindrical quartz bodies, and disposed concentrically with each other with a predetermined gap 10 therebetween. The process container 8 is surrounded by a heating cover 16, which includes a heater 12, such as an electrical heater, and a thermal insulator 14. The heater 12 is disposed over the entire inner surface of the thermal insulator 14.

The bottom of the process container 8 is supported by a cylindrical manifold 18 made of, e.g., stainless steel. A ring support plate 18A extends inward from the inner wall of the manifold 18 and supports the bottom of the inner tube 4. A wafer boat 20 made of quartz is moved up and down through the bottom port of the manifold 18, so that the wafer boat 20 is loaded/unloaded into and from the process container 8.

A number of target substrates or semiconductor wafers W are stacked on a wafer boat 20. For example, in this embodiment, the wafer boat 20 can support 150 product wafers having a diameter of 200 mm and 20 dummy wafers at essentially regular intervals in the vertical direction. In other words, the wafer boat 20 can accommodate 170 wafers in total.

The wafer boat 20 is placed on a rotary table 24 through a heat-insulating cylinder 22 made of quartz. The rotary table 24 is supported by a rotary shaft 28, which penetrates a lid 26 used for opening/closing the bottom port of the manifold 18.

The portion of the lid 26 where the rotary shaft 28 penetrates is provided with, e.g., a magnetic-fluid seal 30, so that the rotary shaft 28 is rotatably supported in an airtightly sealed state. A seal member 32, such as an O-ring, is interposed between the periphery of the lid 26 and the bottom of the manifold is 18, so that the interior of the process container 8 can be kept sealed.

The rotary shaft 28 is attached at the distal end of an arm 36 supported by an elevating mechanism 34, such as a boat elevator. The elevating mechanism 34 moves the wafer boat 20 and lid 26 up and down integratedly. An exhaust port 38 is formed in the side of the manifold 18 to exhaust the atmosphere in the process container 8 through the bottom of the gap 10 between the inner tube 4 and outer tube 6. The exhaust port 38 is connected to a vacuum exhaust section (not shown) including a vacuum pump and so forth.

A gas supply section 40 is connected to the side of the manifold 18 to supply predetermined process gases into the inner tube 4. More specifically, the gas supply section 40 includes a first supply circuit 42 for supplying a first process gas including a silicon-containing gas, and a second supply circuit 44 for supplying a second process gas including a nitriding gas. For example, the silicon-containing gas is HEAD, and the nitriding gas is $NH_3$ gas. Each of the first and second process gases is mixed with a suitable amount of carrier gas, as needed. However, such a carrier gas will not be mentioned, hereinafter, for the sake of simplicity of explanation.

The first and second gas supply circuits 42 and 44 respectively include linear gas nozzles 48 and 50, which penetrate the sidewall of the manifold 18. The gas nozzles 48 and 50 are respectively connected to gas passages 60 and 62. The gas passages 60 and 62 are provided with flow rate controllers 54 and 56, such as mass-flow controllers, so as to respectively supply the first and second process gases at controlled flow rates. In this embodiment, the inner tube 4 of the process container 8 has an inner diameter of about 240 mm, and a height of about 1300 mm. The process container 8 has a volume of about 110 liters.

Next, an explanation will be given of a film-formation method according to the first embodiment, performed in the apparatus described above.

At first, when the film-formation apparatus is in a waiting state with no wafer boat loaded therein, the interior of the process container 8 is kept at a process temperature of, e.g., about 450° C. On the other hand, a number of wafers, e.g. 150 product wafers W and 20 dummy wafers, are transferred into the wafer boat 20, outside the process container 8. After the wafers are transferred, the wafer boat 20, which is at a normal temperature, is loaded into the process container 8 from below, by moving up the lid 26. Then, the bottom port of the manifold 18 is closed by the lid 26 to airtightly seal the interior of the process container 8.

Then, the interior of the process container 8 is vacuum exhausted to a predetermined process pressure of, e.g., about 106 Pa (0.8 Torr). Also, the wafer temperature is increased to a process temperature for film-formation of, e.g., about 450° C. At this time, the apparatus is in a waiting state until the temperature becomes stable.

Then, the first process gas including HEAD gas and the second process gas including $NH_3$ gas are supplied from the respective nozzles 48 and 50 of the gas supply section 40 at controlled flow rates. The two process gases are supplied into the bottom portion of the process container 8 and mixed there. Then, the gases react with each other while flowing upward in the process space S, and cause a silicon nitride thin film to be deposited on the surface of each wafer W. The process gases thus flowing upward in the process space S bounce off the ceiling of the process container 8, and flow through the gap 10 between the inner tube 4 and outer tube 6, and then are exhausted through the exhaust port 38 out of the process container 8.

In this film-formation, the process temperature is preferably set to be within a range of from 400 to 600° C., and more preferably within a range of from 430 to 550° C. The ratio of the HEAD gas flow rate relative to the $NH_3$ gas flow rate is preferably set to be within a range of from 30 to 200, and more preferably within a range of from 50 to 200. The $NH_3$ gas flow rate is preferably set to be within a range of from 10 to 3000 sccm, and more preferably within a range of from 1000 to 2000 sccm. The process pressure is preferably set to be within a range of from 27 to 1333 Pa (0.2 to 10 Torr), and more preferably within a range of from 27 to 133.3 Pa (0.2 to 1.0 Torr).

Although the process temperature is low, a silicon nitride film according to the first embodiment thus formed brings about a low etching rate relative to dilute hydrofluoric acid used in a cleaning process on the surface of the silicon nitride film. As a consequence, the silicon nitride film according to the first embodiment can be prevented from being excessively etched during the cleaning process, thereby improving the controllability in the film thickness. Depending on the conditions, the etching rate of a silicon nitride film according to the first embodiment can be smaller than that of a silicon nitride film formed by thermal CVD using dichlorosilane and $NH_3$ gas at a process temperature of about 760° C.

In order to examine silicon nitride films according to the first embodiment, experiments were conducted. In the experiments, a silicon nitride film was formed under different process conditions, such as the process temperature, gas flow rate (gas flow rate ratio), and process pressure, and then the etching rate of the film relative to dilute hydrofluoric acid was measured. In addition, the same experiments were performed on comparative examples, in which a silicon nitride film was formed, using hexa-chlorodisilane (which will be referred to as HCD, as well) and partly using ethylene gas.

Figure 2:
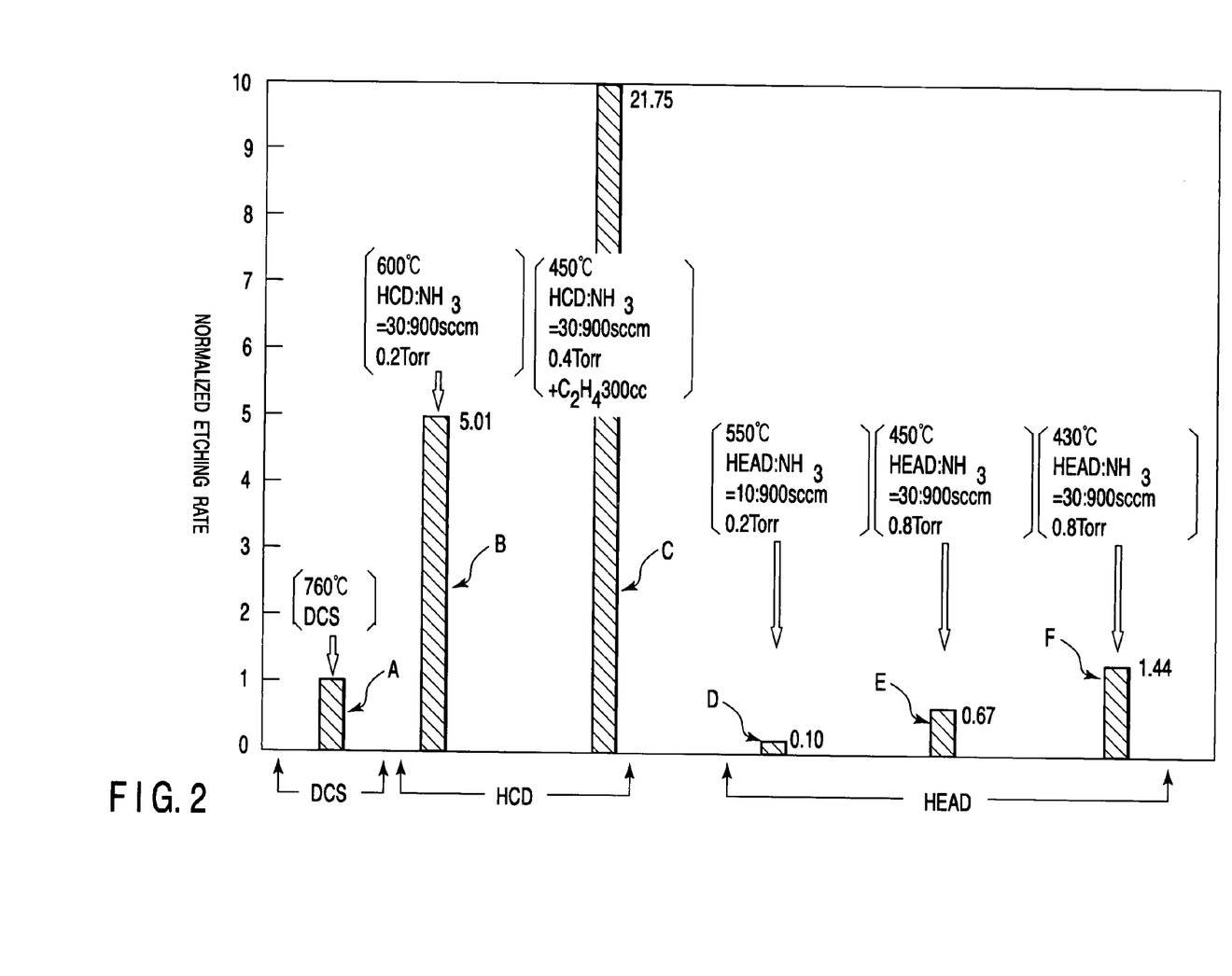
FIG. 2 is a graph showing the relationship between silicon nitride films deposited under different process conditions and their etching rates.

FIG. 2 is a graph showing the relationship between silicon nitride films deposited under different process conditions and their etching rates. In FIG. 2, the etching rates are shown as normalized etching rates, which are ratios relative to a reference value "1" (see the characteristic A). The reference value (the characteristic A) is the etching rate of a silicon nitride film, which was formed by a method (conventional film-formation method) using ammonia gas and dichlorosilane (DCS) at a process temperature of about 760° C.

The characteristic B in FIG. 2 corresponds to a film-formation process using HCD and $NH_3$ at a process temperature of 600° C. In this case, the normalized etching rate of an SiN film increased to 5.01, due to the temperature lower by about 160° C. than that of the characteristic A, in addition to the gas difference. This result is unfavorable, because it means that the SiN film will be excessively etched in the cleaning process.

The characteristic C in FIG. 2 corresponds to a film-formation process using HCD and $NH_3$ (with ethylene gas added thereto) at a process temperature of 450° C. In this case, the normalized etching rate of an SiN film increased to 21.75, due to the temperature further lower by about 150° C. than that of the characteristic B. This result is very unfavorable, because it means that the quality of the SiN film is considerably low.

On the other hand, the characteristic D in FIG. 2 corresponds to a film-formation process using HEAD and $NH_3$ at a process temperature of 550° C. In this case, the normalized etching rate of an SiN film became about 0.10. This result is very favorable, because the etching rate is as small as 1/10 of the characteristic A.

The characteristics E and F in FIG. 2 correspond to film-formation processes using HEAD and $NH_3$ at lower process temperatures of 450° C. and 430° C., respectively. In these cases, the normalized etching rates of an SiN film became about 0.67 and 1.44, respectively. The characteristics E and F are not so good, as compared to the characteristic D, but they are close to the characteristic A. Accordingly, the characteristics E and F are favorable.

Furthermore, a film-formation process was performed, using HEAD and $NH_3$ at a process temperature of 350° C. The film formed by this process consisted essentially of $SiO_2$, i.e., no SiN film was formed.

It has been found from the results described above that, even where a lower process temperature of from 430 to 550° C. is used, as shown in characteristics D to F, a formed SiN film can have an etching rate almost the same as or still lower than that of an SiN film formed by a conventional process using DCS gas at a process temperature of 760° C. Furthermore, the quality of the SiN film of the characteristics D to F was analyzed. The SiN film of the characteristic F was somewhat lower in quality than the SiN films of the characteristics D and E, in terms of the doped nitrogen amount. Accordingly, it has been found that the process temperature is preferably set to be within a range of from 450 to 550° C., in light of the quality of an SiN film as well.

In the characteristics D to F, the gas flow rate of HEAD gas was set at different values within a range of from 10 sccm to 30 sccm, while the gas flow rate of $NH_3$ gas was set at a constant value of 900 sccm. In other words, the ratio of the flow rate of $NH_3$ gas relative to that of HEAD gas was changed within a range of from 30 to 90 times. In these cases, however, each of the formed SiN films had a small etching rate and good film quality.

As shown in the characteristics D to F, the process pressure was set at different values within a range of from 27 Pa (0.2 Torr) to 106 Pa (0.8 Torr), and the formed SiN films had good film quality. Furthermore, additional experiments were performed while increasing the process pressure up to 1330 Pa (10 Torr). Also in this case, each of the formed SiN films had a small etching rate and good film quality.

Second Embodiment

Figure 3:
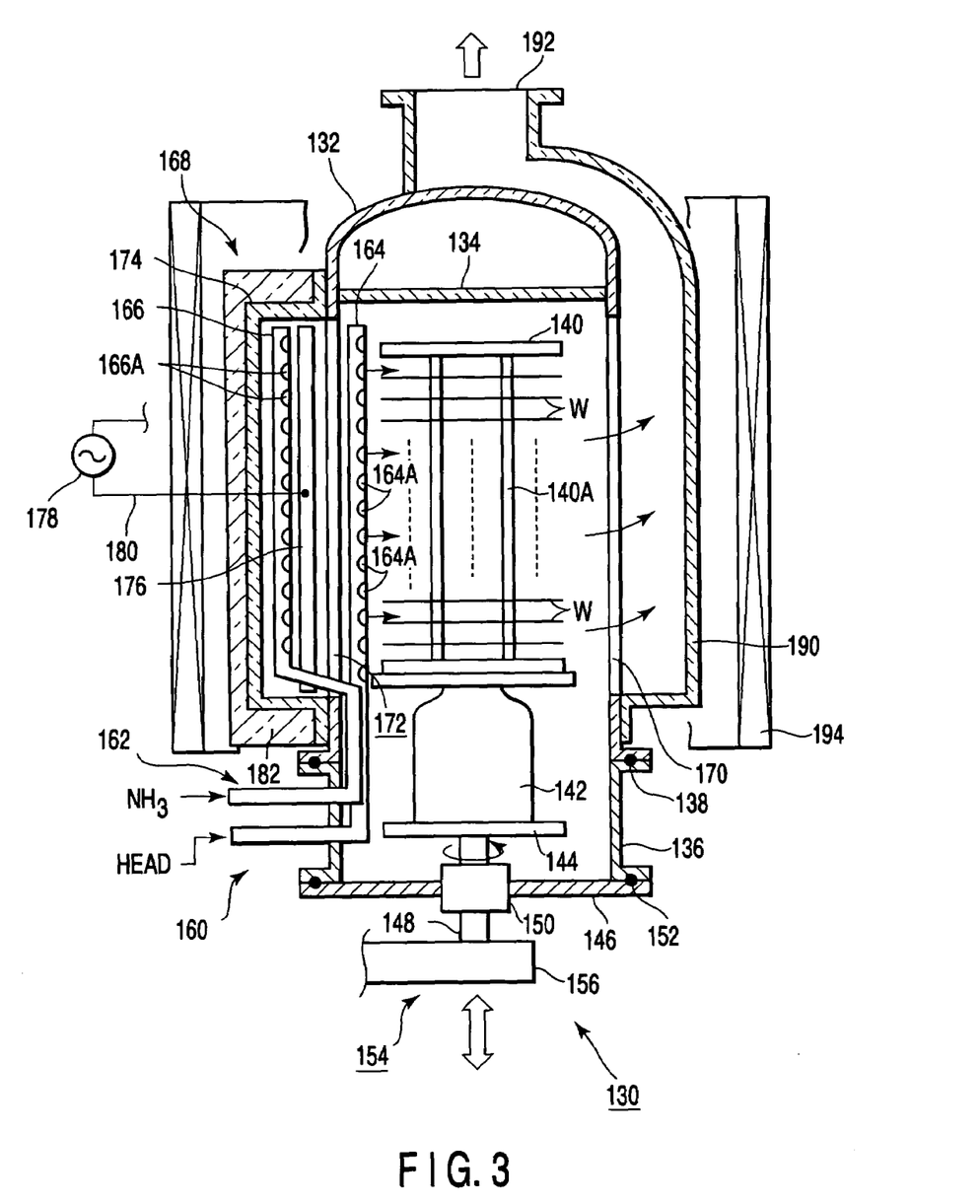
FIG. 3 is a sectional view showing a film-formation apparatus (vertical CVD apparatus) according to a second embodiment of the present invention.
Figure 4:
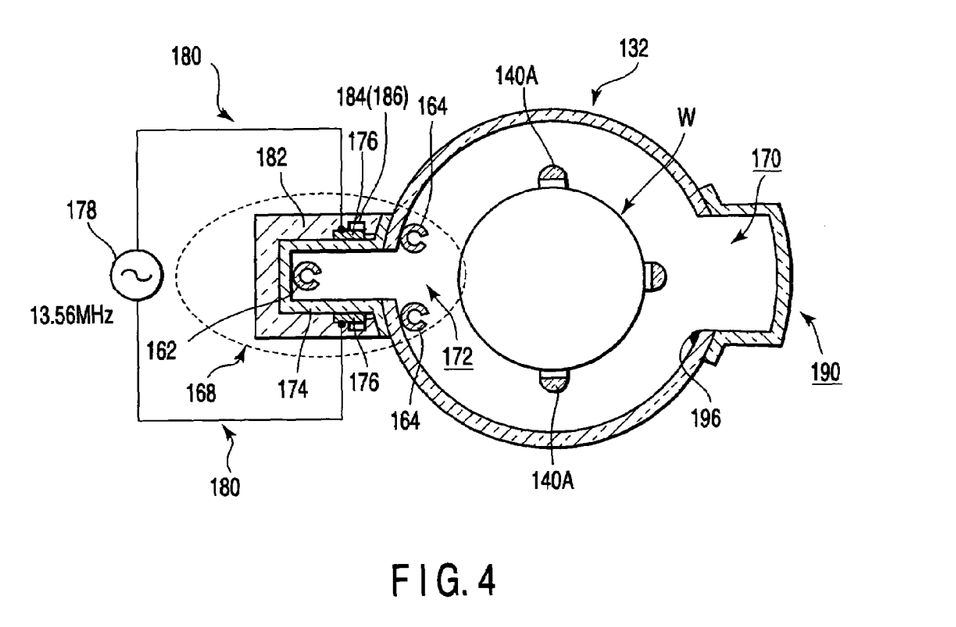
FIG. 4 is a sectional plan view showing part of the apparatus shown in FIG. 3.

FIG. 3 is a sectional view showing a film-formation apparatus (vertical CVD apparatus) according to a second embodiment of the present invention. FIG. 4 is a sectional plan view showing part of the apparatus shown in FIG. 3. The film-formation apparatus 130 is arranged to alternately supply a first process gas including hexaethylaminodisilane (HEAD) gas, and a second process gas including $NH_3$ gas, so as to deposit a silicon nitride film.

The apparatus 130 is of a plasma-processing type and includes a process container 132 shaped as a cylindrical column with a ceiling and an opened bottom. The entirety of the process container 132 is made of, e.g., quartz. The top of the process container 132 is provided with a quartz ceiling plate 134 to airtightly seal the top. The bottom of the process container 132 is connected through a seal member 138, such as O-ring, to a cylindrical manifold 136.

The cylindrical manifold 136 is made of, e.g., stainless steel, and supports the bottom of the process container 132. A wafer boat 140 made of quartz is moved up and down through the bottom port of the manifold 136, so that the wafer boat 140 is loaded/unloaded into and from the process container 132. A number of target substrates or semiconductor wafers W are stacked on a wafer boat 140. For example, in this embodiment, the wafer boat 140 has struts 140A that can support, e.g., about 60 wafers having a diameter of 300 mm at essentially regular intervals in the vertical direction.

The wafer boat 140 is placed on a table 144 through a heat-insulating cylinder 142 made of quartz. The table 144 is supported by a rotary shaft 148, which penetrates a lid 146 made of, e.g., stainless steel, and is used for opening/closing the bottom port of the manifold 136.

The portion of the lid 146 where the rotary shaft 148 penetrates is provided with, e.g., a magnetic-fluid seal 150, so that the rotary shaft 148 is rotatably supported in an airtightly sealed state. A seal member 152, such as an O-ring, is interposed between the periphery of the lid 146 and the bottom of the manifold 136, so that the interior of the process container 132 can be kept sealed.

The rotary shaft 148 is attached at the distal end of an arm 156 supported by an elevating mechanism 154, such as a boat elevator. The elevating mechanism 154 moves the wafer boat 140 and lid 146 up and down integratedly. The table 144 may be fixed to the lid 146, so that wafers W are processed without rotation of the wafer boat 140.

A gas supply section is connected to the side of the manifold 136 to supply predetermined process gases into the process container 132. More specifically, the gas supply section includes a first supply circuit 160 for supplying a first process gas including HEAD, and a second supply circuit 162 for supplying a second process gas including $NH_3$ gas. Each of the first and second process gases is mixed with a suitable amount of carrier gas, as needed. However, such a carrier gas will not be mentioned, hereinafter, for the sake of simplicity of explanation.

More specifically, the first supply circuit 160 includes two first nozzles 164 formed of quartz pipes, which penetrate the sidewall of the manifold 136 from the outside and then turn and extend upward (see FIG. 4). Each of the first nozzles 164 has a plurality of gas spouting holes 164A formed at predetermined intervals in the longitudinal direction (the vertical direction) over the entire wafers W on the wafer boat 140. The gas spouting holes 164A deliver the first process gas almost uniformly in the horizontal direction, so as to form gas flows parallel with the wafers W on the wafer boat 140. The apparatus may have not two but only one first nozzle 164.

The second supply circuit 162 also includes a second nozzle 166 formed of a quartz pipe, which penetrates the sidewall of the manifold 136 from the outside and then turns and extends upward. The second nozzle 166 has a plurality of gas spouting holes 166A formed at predetermined intervals in the longitudinal direction (the vertical direction) over the entire wafers W on the wafer boat 140. The gas spouting holes 166A deliver the second process gas almost uniformly in the horizontal direction, so as to form gas flows parallel with the wafers W on the wafer boat 140. The gas spouting holes 166A have a diameter of, e.g., about 0.4 mm.

A plasma generating section 168 is formed at the sidewall of the process container 132 along the vertical direction. On the side of the process container 132 opposite to the plasma generating section 168, a long and thin exhaust port 170 for exhausting the inner atmosphere is formed by cutting the sidewall of the process container 132 in, e.g., the vertical direction.

More specifically, the plasma generating section 168 has a vertically long and thin opening 172 formed by cutting a predetermined width of the sidewall of the process container 132, in the vertical direction. The opening 172 is covered with a quartz cover 174 airtightly connected to the outer surface of the process container 132 by welding. The cover 174 has a vertical long and thin shape with a concave cross-section, so that it projects outward from the process container 132.

With this arrangement, the plasma generating section 168 is formed such that it projects outward from the sidewall of the process container 132 and is opened on the other side to the interior of the process container 132. In other words, the inner space of the plasma generating section 168 communicates with the interior of the process container 132. The opening 172 has a vertical length sufficient to cover the entire wafers W on the wafer boat 140 in the vertical direction.

A pair of long and thin electrodes 176 are disposed on the opposite outer surfaces of the cover 174, and face each other along the longitudinal direction (the vertical direction). The electrodes 176 are connected to an RF (Radio Frequency) power supply 178 for plasma generation, through feed lines 180. An RF voltage of, e.g., 13.56 MHz is applied to the electrodes 176 to form an RF electric field for exciting plasma between the electrodes 176. The frequency of the RF voltage is not limited to 13.56 MHz, and it may be set at another frequency, e.g., 400 kHz.

The second nozzle 166 is bent outward in the radial direction of the process container 132, at a position lower than the lowermost wafer W on the wafer boat 140. Then, the second nozzle 166 vertically extends at the deepest position (the farthest position from the center of the process container 132) in the plasma generating section 168. As shown also in FIG. 4, the second nozzle 166 is separated outward from an area sandwiched between the pair of electrodes 176 (a position where the RF electric field is most intense), i.e., a plasma generating area PS where the main plasma is actually generated. The second process gas including $NH_3$ gas is spouted from the gas spouting holes 166A of the second nozzle 166 toward the plasma generating area PS. Then, the second process gas is excited (decomposed or activated) in the plasma generating area PS, and is supplied in this state onto the wafers W on the wafer boat 140.

An insulating protection cover 182 made of, e.g., quartz is attached on and covers the outer surface of the cover 174. A cooling mechanism 186 is disposed in the insulating protection cover 182 and comprises coolant passages 184 respectively facing the electrodes 176. The coolant passages 184 are supplied with a coolant, such as cooled nitrogen gas, to cool the electrodes 176. The insulating protection cover 182 is covered with a shield (not shown) disposed on the outer surface to prevent RF leakage.

The two first nozzles 164 extend upward at positions near and outside the opening 172 of the plasma generating section 168, i.e., on both sides of the outside of the opening 172 (in the process container 132). The first process gas including HEAD gas is spouted from the gas spouting holes 164A of the first nozzles 164 toward the center of the process container 132.

On the other hand, the exhaust port 170, which is formed opposite the plasma generating section 168, is covered with an exhaust port cover member 190. The exhaust port cover member 190 is made of quartz with a U-shape cross-section, and attached by welding. The exhaust cover member 190 extends upward along the sidewall of the process container 132, and has a gas outlet 192 at the top of the process container 132. The gas outlet 192 is connected to a vacuum exhaust section (not shown) including a vacuum pump and so forth.

The process container 132 is surrounded by a heater 194, which is used for heating the atmosphere within the process container 132 and the wafers W. A thermocouple 196 (see FIG. 4) is disposed near the exhaust port 170 in the process container 132 to control the heater 194.

Next, an explanation will be given of a film-formation method according to the second embodiment, performed in the apparatus described above.

At first, as in the first embodiment, the wafer boat 140 supporting wafers W is loaded into the process container 132. Then, the interior of the process container 132 is vacuum exhausted to a predetermined process pressure of, e.g., about 106 Pa (0.8 Torr). Also, the wafer temperature is increased to a process temperature for film-formation of, e.g., about 400° C. At this time, the apparatus is in a waiting state until the temperature becomes stable.

Then, the first process gas including HEAD gas and the second process gas including $NH_3$ gas are alternately supplied from the respective nozzles 164 and 166 at controlled flow rates. More specifically, the first process gas is supplied from the gas spouting holes 164A of the first nozzles 164 to form gas flows parallel with the wafers W on the wafer boat 140. The second process gas is supplied from the gas spouting holes 164A of the second nozzle 166 to form gas flows parallel with the wafers W on the wafer boat 140. The two gases react with each other on the wafers W, thereby forming a silicon nitride film on the wafers W.

The second gas supplied from the gas spouting holes 164A of the second nozzle 166 is excited and partly turned into plasma when it passes through the plasma generating area PS between the pair of electrodes 176. At this time, for example, radicals (activated species), such as $N^*$, $NH^*$, $NH_2^*$, and $NH_3^*$, are produced (the symbol [*] denotes that it is a radical). The radicals flow out from the opening 172 of the plasma generating section 168 toward the center of the process container 132, and are supplied into gaps between the wafers W in a laminar flow state.

The radicals react with molecules of HEAD gas adsorbed on the surface of the wafers W, so that a silicon nitride film is formed on the wafers W. Alternatively, when HEAD gas flows onto radicals adsorbed on the surface of the wafers W, the same reaction is caused, so that a silicon nitride film is formed on the wafers W.

Figure 5:
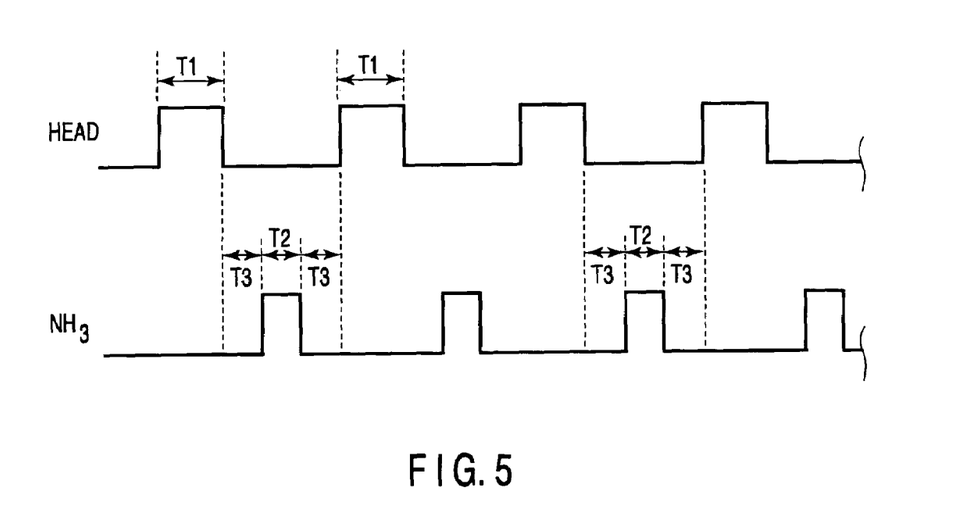
FIG. 5 is a timing chart showing the timing of supplying first and second process gases in the second embodiment.

FIG. 5 is a timing chart showing the timing of supplying first and second process gases in the second embodiment. As shown in FIG. 5, the first and second process gases are intermittently or alternately supplied, and every two gas supplies are separated by a purge period T3 to remove the residual gas in the process container 132 by vacuum-exhaust. A cycle of alternately supplying the first and second process gases is repeated a number of times, and thin films of silicon nitride formed by respective cycles are laminated, thereby arriving at a silicon nitride film having a target thickness.

The term "purge" means removal of the residual gas in the process container 132 by supplying an inactive gas, such as $N_2$ gas, into the process container 132 and/or vacuum-exhausting the interior of the process container 132. In the second embodiment, when the first and second process gases are supplied, the interior of the process container 132 is not vacuum-exhausted. However, when the first and second process gases are supplied, the interior of the process container 132 may be vacuum-exhausted. In this case, the interior of the process container 132 may be continuously vacuum-exhausted over the entirety of the supply periods of the first and second process gases, and the purge periods.

In FIG. 5, the supply period T1 of the first process gas including HEAD gas is set to be within a range of from about 1 to 60 seconds, and preferably within a range of from about 1 to 20 seconds. The supply period T2 of the second process gas including $NH_3$ gas is set to be within a range of from about 1 to 60 seconds, and preferably within a range of from about 1 to 10 seconds. The purge period T3 is set to be within a range of from about 1 to 60 seconds, and preferably within a range of from about 1 to 5 seconds. In other words, the supply rates and supply periods of the first and second process gases in each cycle are set such that, when the first and second process gases are supplied once for each, a silicon nitride film thereby formed preferably has a deposition thickness of from 0.05 to 0.5 nm, and more preferably of from 0.1 to 0.2 nm. Accordingly, if a silicon nitride film is formed to have a target thickness of 10 to 30 nm, the number of cycles is large, such as preferably 20 to 600, and more preferably 50 to 300.

The process temperature of film-formation is preferably set to be within a range of from 300 to 600° C., and more preferably within a range of from 350 to 550° C. The ratio of the $NH_3$ gas flow rate relative to the HEAD gas flow rate is preferably set to be within a range of from 30 to 200, and more preferably within a range of from 50 to 200. The $NH_3$ gas flow rate in each cycle is preferably set to be within a range of from 10 to 3000 sccm, and more preferably within a range of from 1000 to 2000 sccm. The process pressure is preferably set to be within a range of from 27 to 1333 Pa (0.2 to 10 Torr), and more preferably within a range of from 27 to 133.3 Pa (0.2 to 1.0 Torr).

The film-formation method according to the second embodiment can further improve the properties of a silicon nitride film, as compared with the first embodiment. In experiments, silicon nitride films according to first and second embodiments were formed at the same process temperature. As a result, it has been confirmed that the silicon nitride film according to the second embodiment shows a smaller etching rate relative to dilute hydrofluoric acid, as compared with the silicon nitride film according to the first embodiment. In other words, the film-formation method according to the second embodiment can provide a silicon nitride film having an etching rate as low as that of the first embodiment, even where the process temperature of film-formation is lower. Accordingly, the film-formation method according to the second embodiment can employ a lower process temperature, so that the underlying semiconductor device structure is less affected.

In each of the first and second embodiments, the film-formation apparatus is a vertical film-formation apparatus of the batch type. The present invention is not limited to this, and it may be applied to a horizontal film-formation apparatus of the batch type, or a film-formation apparatus of the single-substrate type arranged to process target substrates one by one.

As regards a target substrate, other than a semiconductor wafer, the present invention may also be applied to a glass substrate or LCD substrate.

INDUSTRIAL APPLICABILITY

According to the present invention, there is provided a CVD method for forming a silicon nitride film on a target substrate, which can employ a relatively low process temperature of film-formation, while allowing a cleaning process to be subsequently performed with high controllability in the film thickness of the silicon nitride film.

The invention claimed is:

1. A CVD method for forming a silicon nitride film on a target substrate, the method comprising:
heating the substrate accommodated in a process container, at a process temperature; and
supplying a process gas including hexaethylamino-disilane gas and ammonia gas onto the substrate heated at the process temperature, thereby depositing a silicon nitride film on the substrate.

2. The method according to claim 1, wherein the process temperature is set to be within a range of from 400 to 600° C.

3. The method according to claim 1, wherein a ratio of a flow rate of the ammonia gas relative to a flow rate of the hexaethylaminodisilane gas is set to be within a range of from 30 to 200.

4. The method according to claim 1, wherein depositing the silicon nitride film comprises supplying the process gas into the process container while exhausting the process container, thereby setting the process container to have a process pressure of from 27 to 1333 Pa.

5. The method according to claim 1, wherein the process container is configured to accommodate a plurality of target substrate at intervals in a vertical direction, and the target substrates is heated by a heater disposed around the process container.

6. The method according to claim 1, wherein said process gas comprises
a first process gas including hexaethylaminodisilane gas and a second process gas including ammonia gas, and wherein said supplying a process gas comprises alternately supplying the first process gas and the second process gas in cycles, wherein supplying the second process gas comprises turning the second process gas into plasma for excitation.

7. The method according to claim 6, wherein each cycle is arranged to supply the first process gas for 1 to 60 seconds, and to supply the second process gas for 1 to 60 seconds.

8. The method according to claim 6, wherein supply rates and supply periods of the first and second process gases in each cycle are set such that, when the first and second process gases are supplied once for each, a silicon nitride film thereby formed preferably has a deposition thickness of from 0.05 to 0.5 nm.

9. The method according to claim 6, further comprising purging of the process container between supply of the first process gas and supply of the second process gas, wherein the purging of the process container comprises exhausting the process container while stopping the first and second process gases.

10. The method according to claim 6, wherein the process temperature is set to be within a range of from 300 to 600° C.

11. The method according to claim 6, wherein a ratio of a flow rate of the ammonia gas relative to a flow rate of the hexaethylaminodisilane gas is set to be within a range of from 30 to 200.

12. The method according to claim 6, wherein the second process gas is excited while passing through a plasma generating area, which is disposed in a space communicating with the process container and between a supply port of the second process gas and the substrate.

13. The method according to claim 12, wherein the process container is provided with an electrode and an RF power supply, and the plasma generating area comprises an RF electric field formed between the supply port of the second process gas and the substrate by the electrode and the RF power supply.

14. The method according to claim 13, wherein the process container is configured to accommodate a plurality of target substrate at intervals in a vertical direction, and the target substrates is heated by a heater disposed around the process container.

15. The method according to claim 14, wherein the first and second process gases are supplied from a plurality of first gas spouting holes and a plurality of second gas spouting holes, respectively, to form gas flows parallel with the target substrates, and each group of the first gas spouting holes and the second gas spouting holes are arrayed over the target substrates in a vertical direction.

* * * * *